(12) United States Patent
Ota et al.

(10) Patent No.: US 8,907,386 B2
(45) Date of Patent: *Dec. 9, 2014

(54) LINEAR IMAGE SENSOR

(75) Inventors: Keiichi Ota, Hamamatsu (JP);
Sadaharu Takimoto, Hamamatsu (JP);
Hiroshi Watanabe, Hamamatsu (JP)

(73) Assignee: Hamamatsu Photonics K.K.,
Hamamatsu-shi, Shizuoka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/148,514

(22) PCT Filed: Feb. 8, 2010

(86) PCT No.: PCT/JP2010/051802
§ 371 (c)(1),
(2), (4) Date: Oct. 7, 2011

(87) PCT Pub. No.: WO2010/092928
PCT Pub. Date: Aug. 19, 2010

(65) Prior Publication Data
US 2012/0018834 A1 Jan. 26, 2012

(30) Foreign Application Priority Data

Feb. 13, 2009 (JP) .............................. P2009-031224

(51) Int. Cl.
*H01L 31/062* (2012.01)
*H01L 31/113* (2006.01)
*H01L 27/14* (2006.01)
*H01L 27/146* (2006.01)

(52) U.S. Cl.
CPC ..... *H01L 27/14607* (2013.01); *H01L 27/14636* (2013.01); *H01L 27/14623* (2013.01); *H01L 27/14643* (2013.01)
USPC .............................. 257/291; 257/431; 438/73

(58) Field of Classification Search
None
See application file for complete search history.

(56) References Cited

U.S. PATENT DOCUMENTS 6,040,593 A * 3/2000 Park .............................. 257/292
6,150,676 A 11/2000 Sasaki
(Continued)

FOREIGN PATENT DOCUMENTS

CN 1217580 A 5/1999
CN 1747177 A 3/2006
(Continued)

OTHER PUBLICATIONS

U.S. Office Action dated Oct. 26, 2012 that issued in U.S. Appl. No. 13/201,289 including Double Patenting Rejections on pp. 5-9.

*Primary Examiner* — Andres Munoz
(74) *Attorney, Agent, or Firm* — Drinker Biddle & Reath LLP

(57) ABSTRACT

In a linear image sensor 1 according to an embodiment of the present invention, a plurality of embedded photodiodes PD(n) of an elongated shape are arrayed. Each of the embedded photodiodes PD(n) comprises a first semiconductor region 10 of a first conductivity type; a second semiconductor region 20 formed on the first semiconductor region 10, having a low concentration of an impurity of a second conductivity type, and having an elongated shape; a third semiconductor region 30 of the first conductivity type formed on the second semiconductor region 20 so as to cover a surface of the second semiconductor region 20; and a fourth semiconductor region 40 of the second conductivity type for extraction of charge from the second semiconductor region 20; the fourth semiconductor region 40 comprises a plurality of fourth semiconductor regions arranged as separated in a longitudinal direction of the second semiconductor region on the second semiconductor region 20.

5 Claims, 15 Drawing Sheets

(56) References Cited

U.S. PATENT DOCUMENTS

| | | | | |
|---|---|---|---|---|
| 6,150,704 | A * | 11/2000 | Kozuka | 257/434 |
| 2003/0107107 | A1* | 6/2003 | Chang et al. | 257/590 |
| 2006/0086955 | A1* | 4/2006 | Iwata | 257/226 |
| 2008/0128767 | A1 | 6/2008 | Adkisson et al. | |
| 2011/0291216 | A1* | 12/2011 | Ota et al. | 257/435 |
| 2012/0018834 | A1 | 1/2012 | Ota et al. | |

FOREIGN PATENT DOCUMENTS

| | | |
|---|---|---|
| CN | 1933187 | 3/2007 |
| CN | 1992309 A | 7/2007 |
| CN | 101305261 A | 11/2008 |
| EP | 1052697 | 11/2000 |
| EP | 1310999 | 5/2003 |
| JP | 61-40056 | 2/1986 |
| JP | 4-3473 | 1/1992 |
| JP | 11-112006 | 4/1999 |
| JP | 11-298033 | 10/1999 |
| JP | 2000-236081 A | 8/2000 |
| JP | 2000-311997 | 11/2000 |
| JP | 2002-324908 | 11/2002 |
| JP | 2006-041189 A | 2/2006 |
| JP | 2006-80306 | 3/2006 |
| JP | 2006-093442 | 4/2006 |
| JP | 2007-005697 | 1/2007 |
| JP | 2007-180538 A | 7/2007 |
| WO | WO-2008/123597 A2 | 10/2008 |

* cited by examiner

LINEAR IMAGE SENSOR

TECHNICAL FIELD

The present invention relates to a linear image sensor in which embedded photodiodes of an elongated shape are arranged in a one-dimensional array.

BACKGROUND ART

A linear image sensor consisting of a one-dimensional array of photodiodes is sometimes used in a bar-code reader system or the like and in this case the photodiodes need to have an elongated shape in a direction perpendicular to their array direction. Patent Literature 1 discloses the linear image sensor of this type.

In the linear image sensor described in Patent Literature 1, a plurality of light receiving portions with pn junction type photodiodes of an elongated shape are arranged in a one-dimensional array. In this linear image sensor, each pn junction type photodiode is formed of an n-type semiconductor substrate and a p-type semiconductor region formed on the n-type semiconductor substrate, and an amount of charge according to an intensity of incident light is accumulated in a pn junction capacitance formed by these n-type semiconductor substrate and p-type semiconductor region. In this linear image sensor, a transistor is formed adjacently to the pn junction type photodiode and the charge accumulated in the pn junction type photodiode is read out by this transistor. In this linear image sensor, however, since the charge is accumulated in the pn junction capacitance of the pn junction type photodiode, if the pn junction region becomes large in the elongated shape, its pn junction capacitance also becomes large, causing a problem of reduction in response speed.

With respect to this problem, there is a conventionally-developed linear image sensor using embedded photodiodes instead of the pn junction type photodiodes. In each embedded photodiode, for example, an n-type low-concentration semiconductor region is formed on a p-type substrate and a thin p-type high-concentration semiconductor region is formed on a surface of this n-type low-concentration semiconductor region. In this embedded photodiode, since the n-type low-concentration semiconductor region can be made completely depleted, an apparent pn junction capacitance in readout of charge can be made zero. As a result, the response speed can increase.

CITATION LIST

Patent Literature

Patent Literature 1: Japanese Patent Application Laid-open No. 61-40056

SUMMARY OF INVENTION

Technical Problem

In the embedded photodiode, if having an elongated shape, however, when the charge is read out from one end of the elongated shape, a potential gradient from an edge part opposite to the readout part in the longitudinal direction to the readout part becomes almost null, and then it becomes difficult to read the charge in the edge part in the longitudinal direction in the n-type low-concentration semiconductor region by drift, causing a remnant charge in readout operation. As a result, there is a possibility of occurrence of image lag.

It is therefore an object of the present invention to provide a linear image sensor capable of reducing the remnant charge in readout operation.

Solution to Problem

A linear image sensor of the present invention is a linear image sensor in which a plurality of embedded photodiodes of an elongated shape are arrayed. Each of the embedded photodiodes comprises a first semiconductor region of a first conductivity type; a second semiconductor region formed on the first semiconductor region, having a low concentration of an impurity of a second conductivity type, and having an elongated shape; a third semiconductor region of the first conductivity type formed on the second semiconductor region so as to cover a surface of the second semiconductor region; and a fourth semiconductor region of the second conductivity type for extraction of charge from the second semiconductor region; the fourth semiconductor region comprises a plurality of fourth semiconductor regions arranged as separated in a longitudinal direction of the second semiconductor region on the second semiconductor region.

Since in this linear image sensor the plurality of fourth semiconductor regions for extraction of charge from the second semiconductor region (photosensitive region) are arranged as separated in the longitudinal direction, the distance can be made short from the fourth semiconductor regions to an edge of the second semiconductor region. In the embedded photodiode, therefore, a sufficient potential gradient to the fourth semiconductor regions can be ensured, which can reduce the remnant charge in readout from the second semiconductor region. As a result, it is feasible to suppress the occurrence of image lag.

The plurality of fourth semiconductor regions are preferably arranged along a center axis extending in the longitudinal direction of the second semiconductor region.

This configuration allows the distance to be made shorter from the fourth semiconductor regions to the edge of the second semiconductor region.

The plurality of fourth semiconductor regions are preferably arranged along a long side extending in the longitudinal direction of the second semiconductor region.

This configuration allows an interconnection connected to the fourth semiconductor regions to be arranged on the first semiconductor region between the second semiconductor regions in adjacent embedded photodiodes, and this interconnection can reduce a rate of covering the second semiconductor region of the photosensitive region. As a result, it is feasible to increase an aperture ratio of the photosensitive region and to improve the sensitivity of detection of light.

The plurality of fourth semiconductor regions are preferably arranged alternately in a staggered pattern along two long sides extending in the longitudinal direction of the second semiconductor region.

This configuration allows the distance to be made shorter from the fourth semiconductor regions to the edge of the second semiconductor region even if the second semiconductor region becomes long in a direction perpendicular to the longitudinal direction.

The linear image sensor preferably comprises a light blocking film to cover the fourth semiconductor regions, the light blocking film extending in an array direction.

When the fourth semiconductor regions are arranged along the long side extending in the longitudinal direction of the second semiconductor region and when incident light impinges over adjacent light receiving portions and on a charge readout line of an embedded photodiode of one light receiving portion, the sensitivity of the one light receiving portion becomes lower by the area of the fourth semiconductor region, which can cause a discrepancy between the light detection sensitivities of the adjacent light receiving portions.

Similarly, even in the case where the linear image sensor has the structure in which the plurality of fourth semiconductor regions are arranged along the center axis extending in the longitudinal direction of the second semiconductor region and where a charge readout line connected to the fourth semiconductor regions is drawn in an array direction of the light receiving portions and extends on the first semiconductor region between the second semiconductor regions in adjacent embedded photodiodes, when incident light impinges over the adjacent light receiving portions and on the charge readout line of the embedded photodiode in one light receiving portion, the sensitivity of the one light receiving portion becomes lower by the area of the charge readout line extending in the array direction, which can cause a discrepancy between the light detection sensitivities of the adjacent light receiving portions.

However, the aforementioned configuration provides the light blocking film extending in the array direction so as to cover the fourth semiconductor regions, and therefore the shape of the photosensitive region can be made bilaterally symmetric with respect to the center axis extending in the longitudinal direction of the light receiving portion. Therefore, even if light impinges over the adjacent light receiving portions, the discrepancy between the light detection sensitivities of the adjacent light receiving portions can be reduced.

Advantageous Effects of Invention

The present invention allows the linear image sensor to reduce the remnant charge in readout operation. As a result, it is feasible to suppress the occurrence of image lag.

DESCRIPTION OF EMBODIMENTS

The preferred embodiments of the present invention will be described below in detail with reference to the drawings. In each drawing, identical or equivalent portions will be denoted by the same reference signs.

Figure 1:
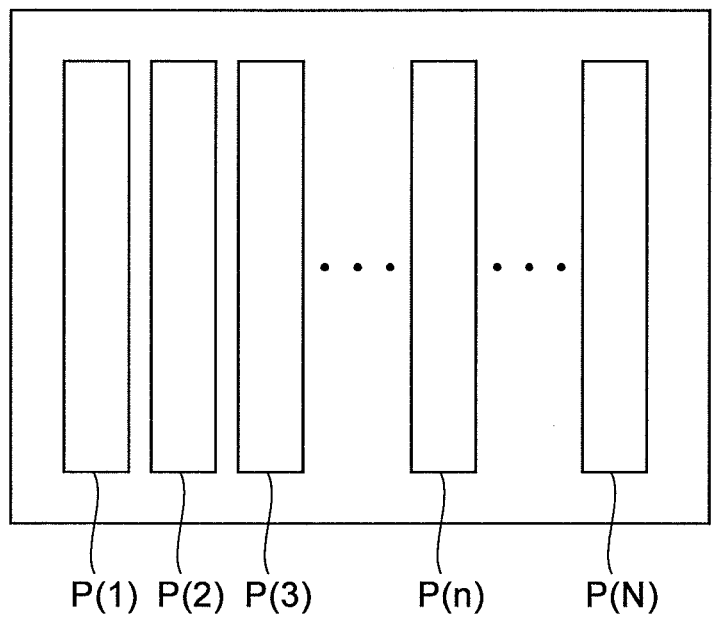
FIG. 1 is a drawing showing a configuration of a linear image sensor according to an embodiment of the present invention.

FIG. 1 is a drawing showing a configuration of a linear image sensor according to an embodiment of the present invention. The linear image sensor 1 shown in FIG. 1 is provided with N light receiving portions P(n) arranged in a one-dimensional array. Here, N is an integer of not less than 2 and n any integer of not less than 1 and not more than N. FIG. 1 is drawn without illustration of a control section for controlling operations of the respective light receiving portions P(n), a signal processing section for processing signals read out of the respective light receiving portions P(n), and so on, in order to clearly show the feature of the present invention. A plurality of embodiments will be described below as examples of the light receiving portions P(n) having the feature of the present invention.

First Embodiment

Figure 2:
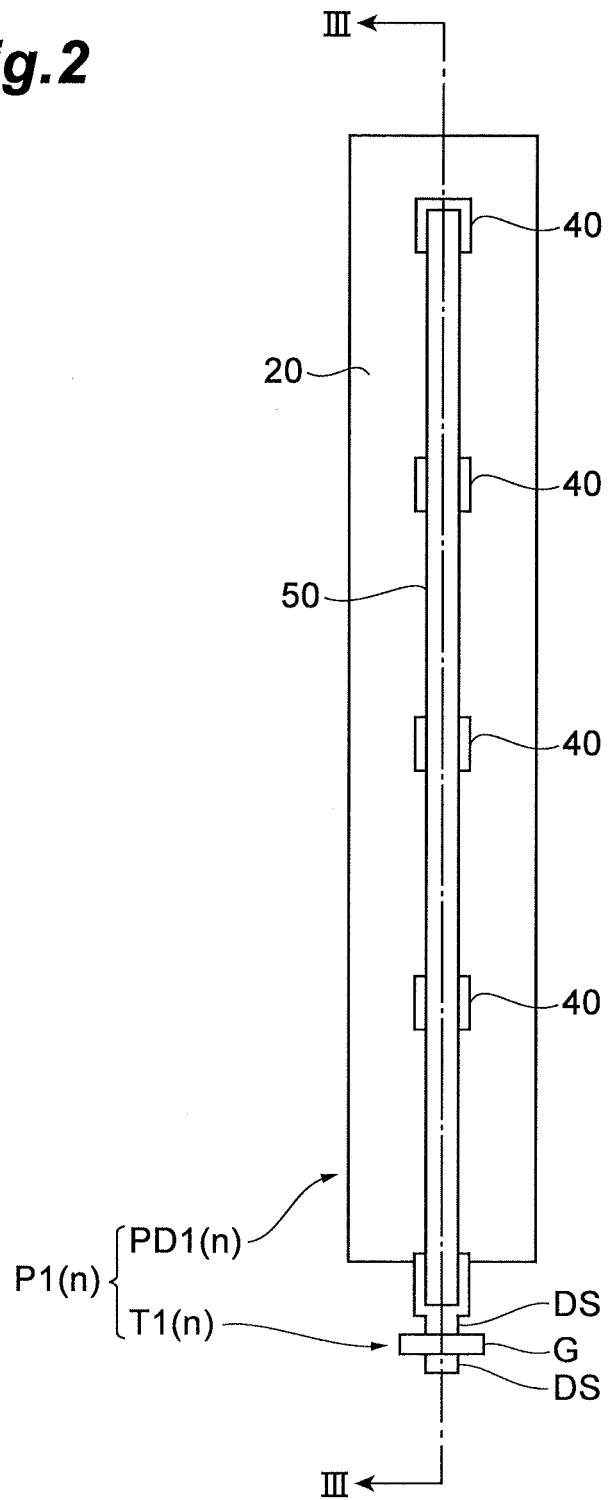
FIG. 2 is a drawing showing the first embodiment of light receiving portions shown in FIG. 1, which shows a light receiving portion viewed from the front side.
Figure 3:
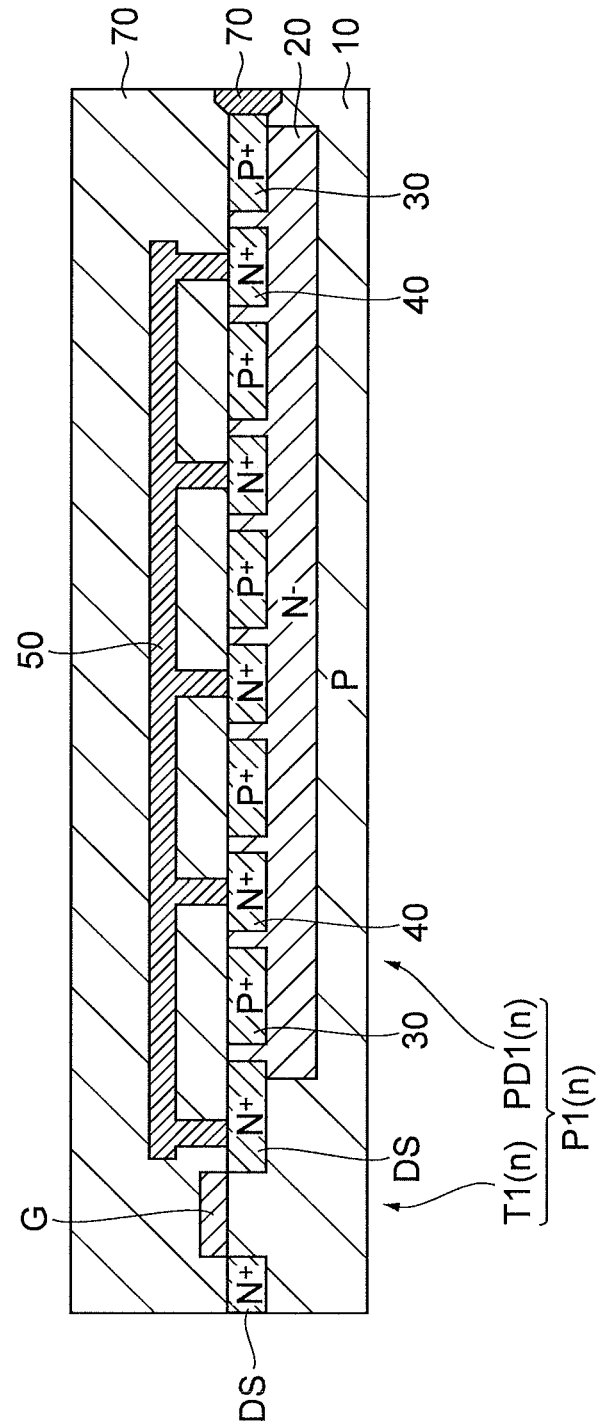
FIG. 3 is a drawing showing a cross section of the light receiving portion along the line III-III in FIG. 2.

FIG. 2 is a drawing showing the first embodiment of the light receiving portions P(n) shown in FIG. 1, which shows the light receiving portion P1(n) viewed from the front side, and FIG. 3 is a drawing showing a cross section of the light receiving portion P1(n) along the line in FIG. 2. In FIGS. 2 and 3, the nth light receiving portion P1(n) is shown on behalf of the N light receiving portions P1(n). This light receiving portion P1(n) has an embedded photodiode PD1(n) and a transistor T1(n). FIG. 2 is drawn without illustration of below-described p-type high-concentration semiconductor region 30 in the embedded photodiode PD1(n), for easier understanding of the feature of the present invention.

The embedded photodiode PD1(n) has a p-type substrate 10, an n-type low-concentration semiconductor region 20 formed on this p-type substrate 10, a p-type high-concentration semiconductor region 30 formed on this n-type low-concentration semiconductor region 20, and a plurality of n-type high-concentration semiconductor regions 40 formed on the n-type low-concentration semiconductor region 20. These p-type substrate 10, n-type low-concentration semiconductor region 20, p-type high-concentration semiconductor region 30, and n-type high-concentration semiconductor regions 40 correspond to the first semiconductor region, the second semiconductor region, the third semiconductor region, and the fourth semiconductor regions, respectively, described in the scope of claims, and the p-type and the n-type correspond to the first conductivity type and the second conductivity type, respectively, described in the scope of claims.

A p-type impurity concentration of the p-type substrate 10 is, for example, approximately $10^{15}$ cm$^{-3}$ to $10^{17}$ cm$^{-3}$. On the p-type substrate 10, the n-type low-concentration semiconductor region 20 is formed so as to be embedded in a portion of the p-type substrate 10.

The n-type low-concentration semiconductor region 20 is of an elongated shape. For example, the n-type low-concentration semiconductor region 20 has the thickness of about 0.6 μm to 1.0 μm, and an n-type impurity concentration of the n-type low-concentration semiconductor region 20 is relatively low, about $10^{16}$ cm$^{-3}$ to $10^{18}$ cm$^{-3}$. The p-type high-concentration semiconductor region 30 and n-type high-concentration semiconductor regions 40 are formed on a surface of the n-type low-concentration semiconductor region 20.

The p-type high-concentration semiconductor region 30 is formed so as to cover the surface of the n-type low-concentration semiconductor region 20 and the thickness thereof is small, 0.2 μm to 0.4 μm. A p-type impurity concentration of the p-type high-concentration semiconductor region 30 is relatively high, about $10^{17}$ cm$^{-3}$ to $10^{19}$ cm$^{-3}$.

These p-type substrate 10, n-type low-concentration semiconductor region 20, and p-type high-concentration semiconductor region 30 form a photosensitive region and an amount of charge generated according to an intensity of light incident into this photosensitive region is accumulated in a pn junction part formed by the p-type substrate 10 and the n-type low-concentration semiconductor region 20 and in a pn junction part formed by the n-type low-concentration semiconductor region 20 and the p-type high-concentration semiconductor region 30.

Since the n-type impurity concentration of the n-type low-concentration semiconductor region 20 is low as described above, the n-type low-concentration semiconductor region 20 can be made completely depleted and the charge in the pn junction parts can be completely read out.

By forming the thin p-type high-concentration semiconductor region 30 on the surface of the n-type low-concentration semiconductor region 20 and applying a reference voltage to this p-type high-concentration semiconductor region 30, the p-type high-concentration semiconductor region 30, or the substrate surface can be prevented from being depleted even if the n-type low-concentration semiconductor region 20 is completely depleted. As a consequence, a leak current (dark current), which can be generated due to charge possibly existing on the substrate surface, can be reduced, so as to increase S/N ratios in detection of light.

On the other hand, there are the n-type high-concentration semiconductor regions 40 formed at a plurality of locations (e.g., four locations) so as to be surrounded by the p-type high-concentration semiconductor region 30. These n-type high-concentration semiconductor regions 40 are arranged as separated at nearly equal intervals along the center axis extending in the longitudinal direction of the n-type low-concentration semiconductor region 20. The n-type high-concentration semiconductor regions 40 have the relatively small thickness of 0.2 μm to 0.4 μm and an n-type impurity concentration of the n-type high-concentration semiconductor regions 40 is relatively high, about $10^{19}$ cm$^{-3}$ to $10^{21}$ cm$^{-3}$. These n-type high-concentration semiconductor regions 40 each are connected through a contact, a via contact, and an interconnection 50 to the transistor T1($n$).

The transistor T1($n$) is composed of n-type high-concentration semiconductor regions DS corresponding to a drain and a source, and a gate electrode G. The transistor T1($n$) is formed adjacently to the embedded photodiode PD1($n$) in the longitudinal direction thereof, and, for example, one of the n-type high-concentration semiconductor regions DS also serves as one of the n-type high-concentration semiconductor regions 40 in the embedded photodiode PD1($n$) and is connected to the interconnection 50 so as to be connected to all the n-type high-concentration semiconductor regions 40. The transistor T1($n$) becomes turned on according to a voltage applied to the gate electrode G, whereby the charge extracted from the n-type low-concentration semiconductor region 20 through the n-type high-concentration semiconductor regions 40 can be read from one n-type high-concentration semiconductor region DS into the other n-type high-concentration semiconductor region DS.

The interconnection 50 is arranged so as to extend in the longitudinal direction along the center axis of the n-type low-concentration semiconductor region 20.

The surface and side faces of the substrate are protected by silicon oxide film 70.

The operational effect of the linear image sensor 1 of the first embodiment will be described below in comparison to a linear image sensor 1X as a comparative example of the present invention.

The linear image sensor 1X of the comparative example of the present invention is provided with N light receiving portions Px(n) arranged in a one-dimensional array, as the linear image sensor 1 of the first embodiment shown in FIG. 1 is, and the light receiving portions Px(n) are different from those in the first embodiment in that each light receiving portion has an embedded photodiode PDx(n) instead of the embedded photodiode PD1($n$). The other configuration of the linear image sensor 1X is the same as that of the linear image sensor 1.

Figure 4:
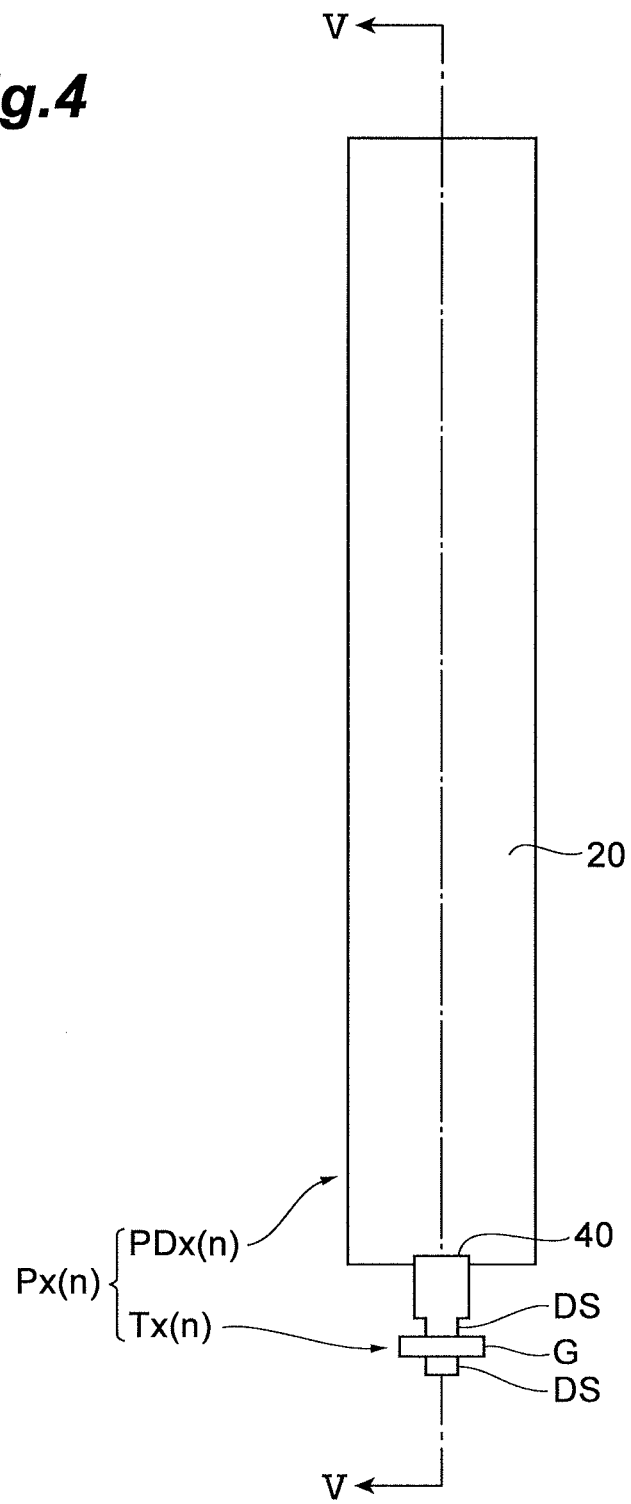
FIG. 4 is a drawing showing a light receiving portion of a comparative example of the present invention viewed from the front side.
Figure 5:
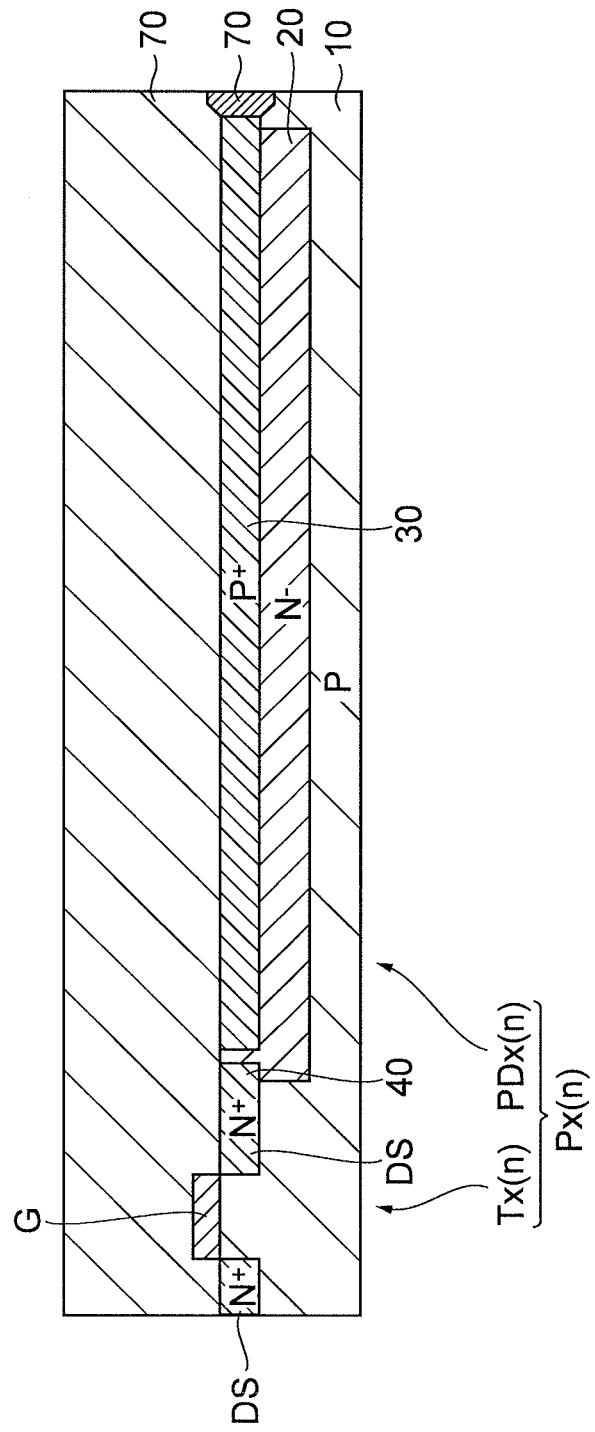
FIG. 5 is a drawing showing a cross section of the light receiving portion along the line V-V in FIG. 4.

FIG. 4 is a drawing of the light receiving portion Px(n) of the comparative example viewed from the front side and FIG. 5 is a drawing showing a cross section of the light receiving portion Px(n) along the line V-V in FIG. 4. FIG. 4 is also drawn without illustration of the p-type high-concentration semiconductor region 30 in the embedded photodiode PDx(n).

The embedded photodiode PDx(n) of the comparative example is different in the number of n-type high-concentration semiconductor regions 40 in the embedded photodiode PD(n) of the first embodiment. Namely, the embedded photodiode PDx(n) of the comparative example has only one n-type high-concentration semiconductor region 40 for extraction of charge formed at one end in the longitudinal direction of the n-type low-concentration semiconductor region 20 and on the transistor Tx(n) side. The n-type high-concentration semiconductor region 40 is formed integrally with an n-type high-concentration semiconductor region DS corresponding to a drain or a source of the transistor Tx(n).

In this embedded photodiode PDx(n) of the comparative example, the distance is long from the n-type high-concentration semiconductor region 40 formed at one end in the longitudinal direction of the n-type low-concentration semiconductor region 20, to the edge at the other end in the longitudinal direction of the n-type low-concentration semiconductor region 20. For this reason, a potential gradient from the other end of the n-type low-concentration semiconductor region 20 to the n-type high-concentration semiconductor region 40 becomes almost null and it becomes difficult to extract charge on the other end side of the n-type low-concentration semiconductor region 20, which can result in occurrence of remnant charge in readout. As a result, image lag might be caused.

In the case of the linear image sensor 1 provided with the embedded photodiodes PD1($n$) and light receiving portions P1($n$) of the first embodiment, however, the plurality of n-type high-concentration semiconductor regions (fourth semiconductor regions) 40 for extraction of charge from the n-type low-concentration semiconductor region (second semiconductor region; photosensitive region) 20 are arranged as separated in the longitudinal direction, which can decrease the distance from the n-type high-concentration semiconductor regions 40 to the edge of the n-type low-concentration semiconductor region 20. Therefore, a sufficient potential gradient to the fourth semiconductor regions can be ensured in the embedded photodiode PD1(n), which can decrease the remnant charge in readout of charge from the n-type low-concentration semiconductor region 20. As a result, it is feasible to suppress the occurrence of image lag.

Second Embodiment

Figure 6:
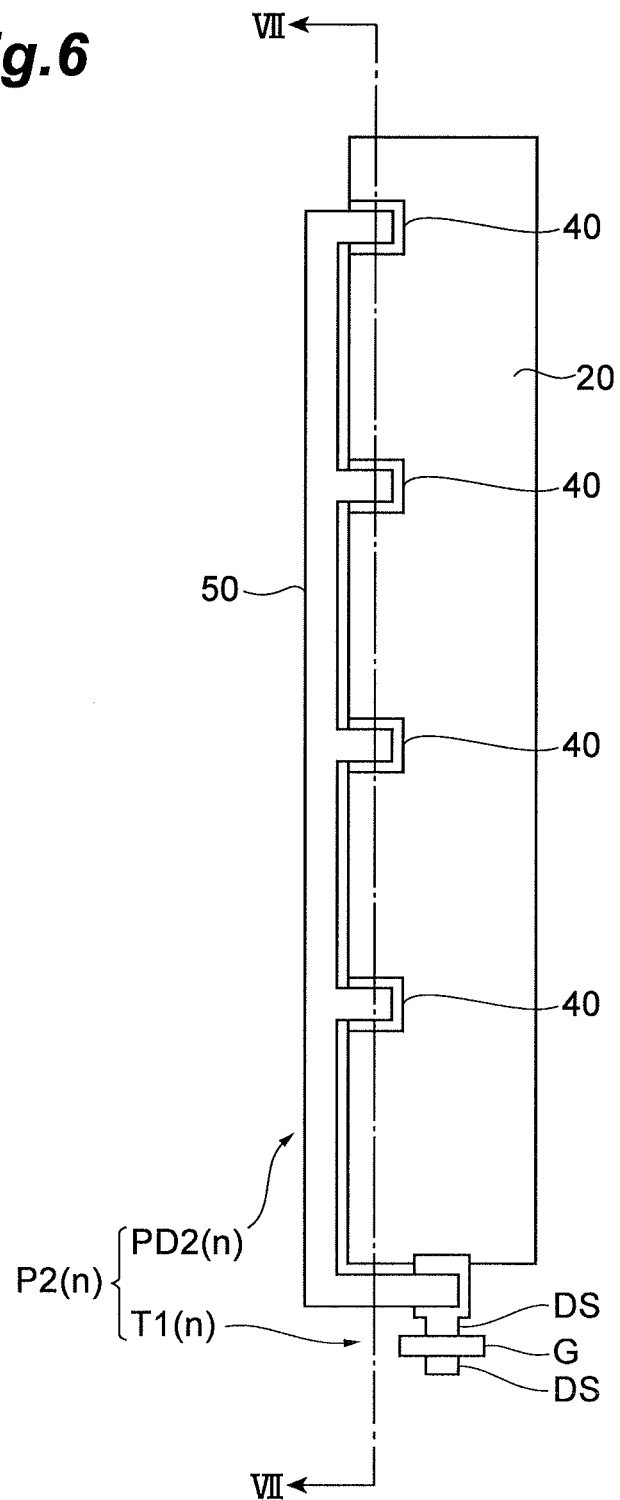
FIG. 6 is a drawing showing the second embodiment of the light receiving portions shown in FIG. 1, which shows a light receiving portion viewed from the front side.
Figure 7:
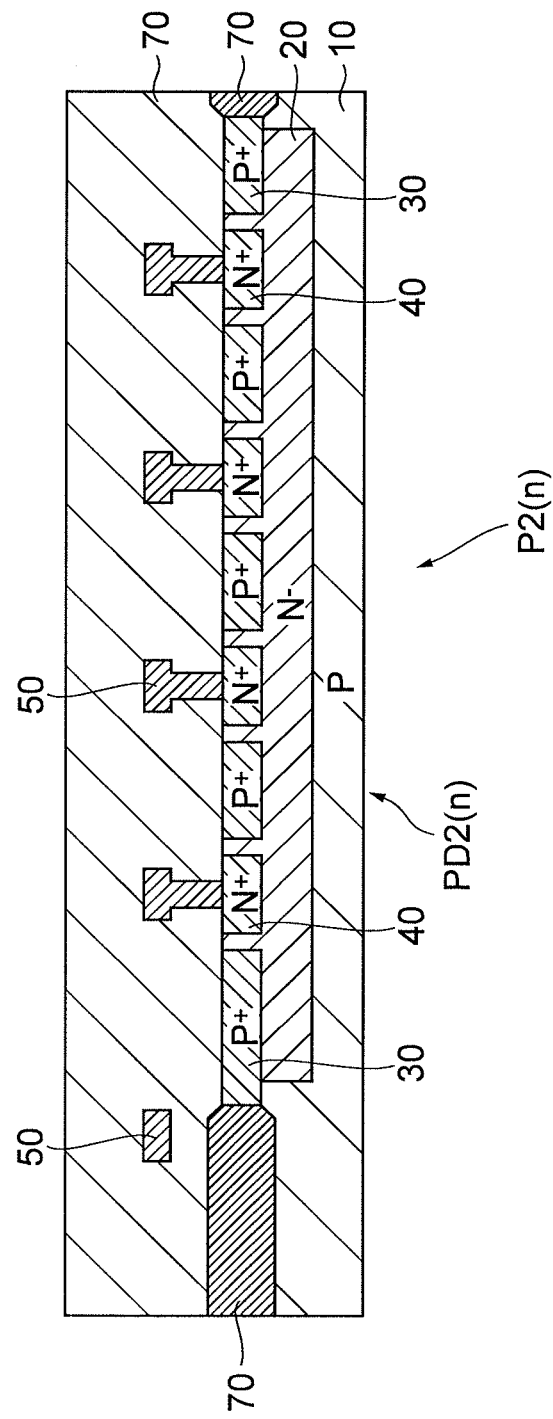
FIG. 7 is a drawing showing a cross section of the light receiving portion along the line VII-VII in FIG. 6.

FIG. 6 is a drawing showing the second embodiment of the light receiving portions P(n) shown in FIG. 1, which shows the light receiving portion P2(n) viewed from the front side, and FIG. 7 is a drawing showing a cross section of the light receiving portion P2(n) along the line VII-VII in FIG. 6. In FIGS. 6 and 7, the nth light receiving portion P2(n) is shown on behalf of the N light receiving portions P2(n). This light receiving portion P2(n) has an embedded photodiode PD2(n) and the aforementioned transistor T1(n). FIG. 6 is drawn without illustration of below-described p-type high-concentration semiconductor region 30 in the embedded photodiode PD2(n), for easier understanding of the feature of the present invention.

The embedded photodiode PD2(n) of the second embodiment is different in the forming positions of the n-type high-concentration semiconductor regions 40 from the embedded photodiode PD1(n) of the first embodiment. Namely, the plurality of n-type high-concentration semiconductor regions 40 are arrayed as separated at nearly equal intervals along a long side extending in the longitudinal direction of the n-type low-concentration semiconductor region 20. The other configuration of the embedded photodiode PD2(n) is the same as that of the embedded photodiode PD1(n).

In the light receiving portion P2(n) of the second embodiment, the interconnection 50 connected to the plurality of n-type high-concentration semiconductor regions 40 of the embedded photodiode PD2(n) is arranged on the p-type substrate 10 between the n-type low-concentration semiconductor regions 20 in adjacent embedded photodiodes PD2(n).

The linear image sensor 1A with the embedded photodiodes PD2(n) and light receiving portions P2(n) of the second embodiment can also enjoy the same advantage as the linear image sensor 1 of the first embodiment.

In the linear image sensor 1A with the embedded photodiodes PD2(n) and light receiving portions P2(n) of the second embodiment, the n-type high-concentration semiconductor regions 40 for extraction of charge from the n-type low-concentration semiconductor region 20 are formed along the long side extending in the longitudinal direction of the n-type low-concentration semiconductor region 20 and the interconnection 50 connected to these n-type high-concentration semiconductor regions 40 is arranged between the n-type low-concentration semiconductor regions 20; therefore, it is feasible to reduce a rate of interconnection 50 covering the n-type low-concentration semiconductor region 20 of the photosensitive region. As a result, it is feasible to increase an aperture ratio of the photosensitive region and thus to improve the sensitivity of detection of light.

Third Embodiment

Figure 8:
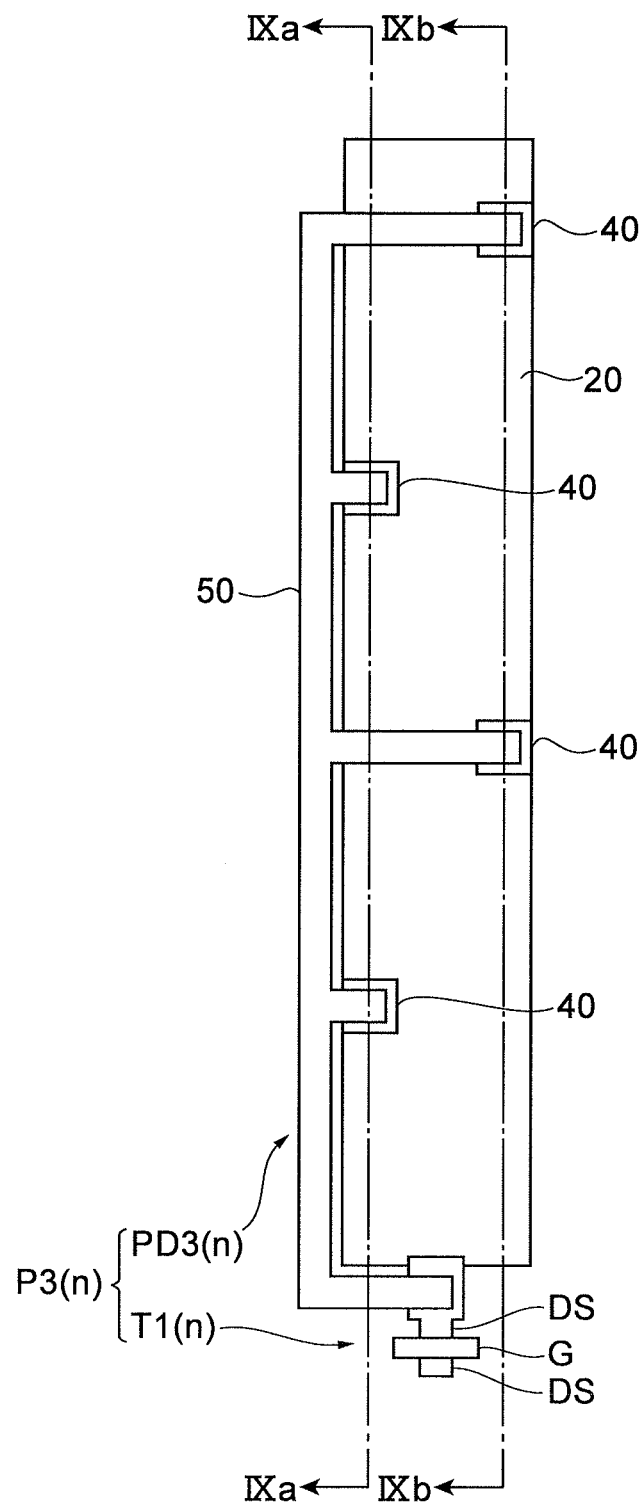
FIG. 8 is a drawing showing the third embodiment of the light receiving portions shown in FIG. 1, which shows a light receiving portion viewed from the front side.
Figure 9:
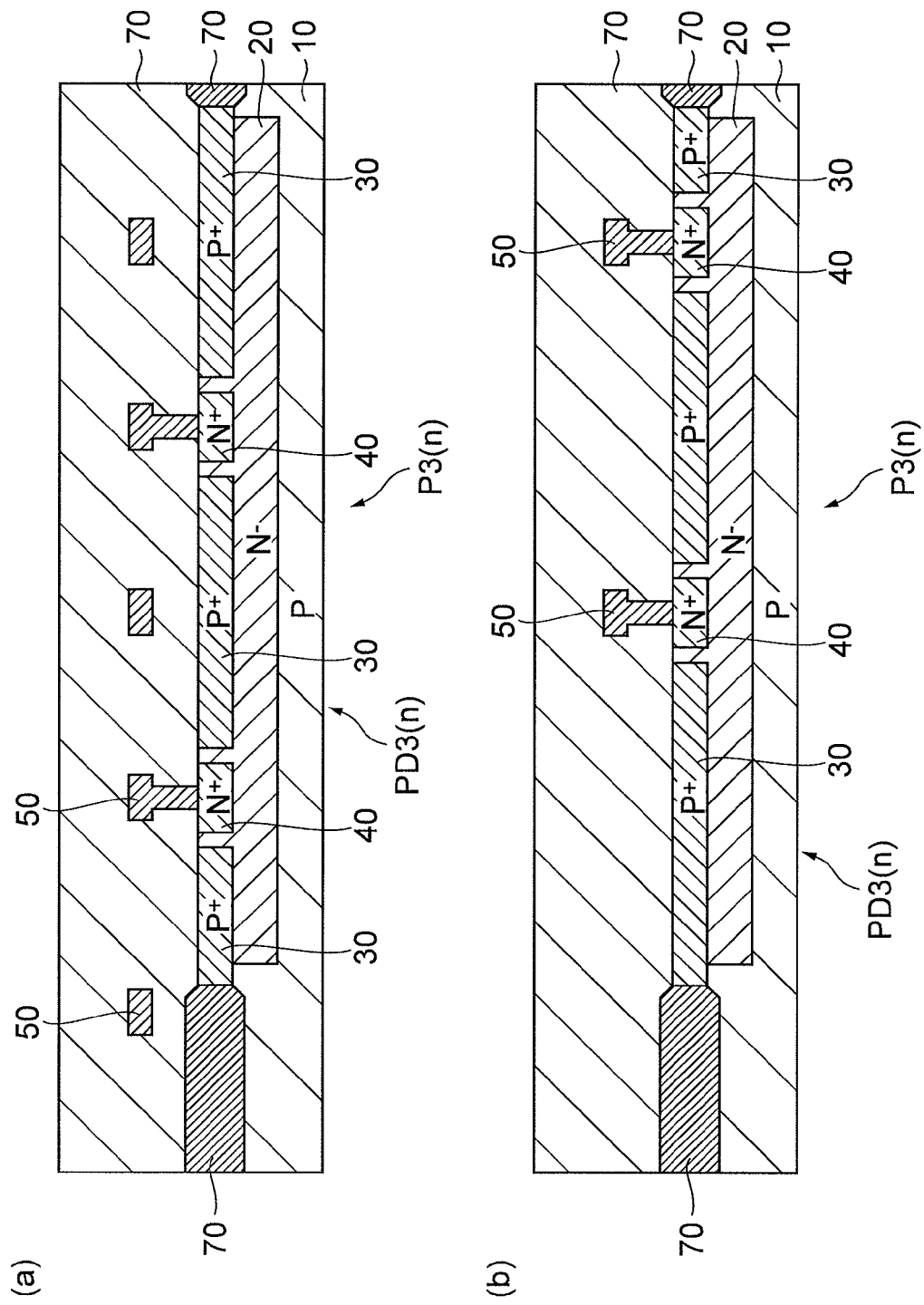
FIG. 9 is a drawing showing a cross section of the light receiving portion along the line IX-IX in FIG. 8.

FIG. 8 is a drawing showing the third embodiment of the light receiving portions P(n) shown in FIG. 1, which shows the light receiving portion P3(n) viewed from the front side, and FIG. 9 (a) is a drawing showing a cross section of the light receiving portion P3(n) along the line IXa-IXa in FIG. 8. FIG. 9 (b) is a drawing showing a cross section of the light receiving portion P3(n) along the line IXb-IXb in FIG. 8. In FIGS. 8 and 9, the nth light receiving portion P3(n) is shown on behalf of the N light receiving portions P3(n). This light receiving portion P3(n) has an embedded photodiode PD3(n) and the aforementioned transistor T1(n). FIG. 8 is drawn without illustration of below-described p-type high-concentration semiconductor region 30 in the embedded photodiode PD3(n), for easier understanding of the feature of the present invention.

The embedded photodiode PD3(n) of the third embodiment is different in the forming positions of the n-type high-concentration semiconductor regions 40 from the embedded photodiode PD1(n) of the first embodiment. Namely, the plurality of n-type high-concentration semiconductor regions 40 are arrayed as separated alternately in a staggered pattern and at nearly equal intervals along two long sides extending in the longitudinal direction of the n-type low-concentration semiconductor region 20. In other words, the plurality of n-type high-concentration semiconductor regions 40 are arrayed as separated alternately in a zigzag pattern along the two long sides extending in the longitudinal direction of the n-type low-concentration semiconductor region 20. The other configuration of the embedded photodiode PD3(n) is the same as that of the embedded photodiode PD1(n).

In the light receiving portion P3(n) of the third embodiment, the interconnection 50 connected to the plurality of n-type high-concentration semiconductor regions 40 of the embedded photodiode PD3(n) is arranged on the p-type substrate 10 between the n-type low-concentration semiconductor regions 20 in adjacent embedded photodiodes PD3(n).

The linear image sensor 1B with the embedded photodiodes PD3(n) and light receiving portions P3(n) of the third embodiment can also enjoy the same advantage as the linear image sensor 1 of the first embodiment.

In the linear image sensor 1B with the embedded photodiodes PD3(n) and light receiving portions P3(n) of the third embodiment, the plurality of n-type high-concentration semiconductor regions 40 are arrayed alternately in the staggered pattern along the two long sides of the n-type low-concentration semiconductor region 20; therefore, it is feasible to make the distance appropriately short from the n-type high-concentration semiconductor regions 40 to the edge of the n-type low-concentration semiconductor region 20 even if the n-type low-concentration semiconductor region 20 becomes large in the direction perpendicular to the longitudinal direction thereof. Therefore, a sufficient potential gradient to the fourth semiconductor regions can be ensured in the embedded photodiode PD3(n), which can appropriately reduce the remnant charge in readout of charge from the n-type low-concentration semiconductor region 20.

Fourth Embodiment

Figure 10:
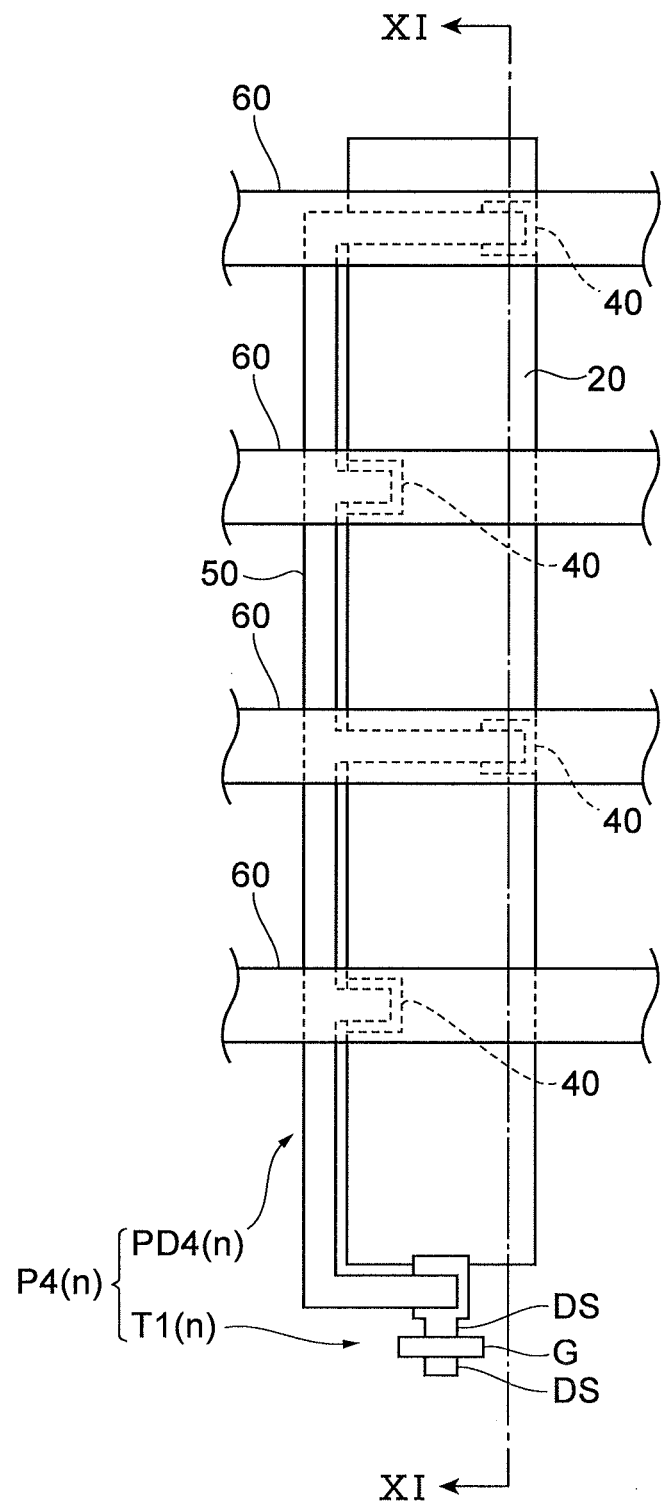
FIG. 10 is a drawing showing the fourth embodiment of the light receiving portions P(n) shown in FIG. 1, which shows a light receiving portion viewed from the front side.
Figure 11:
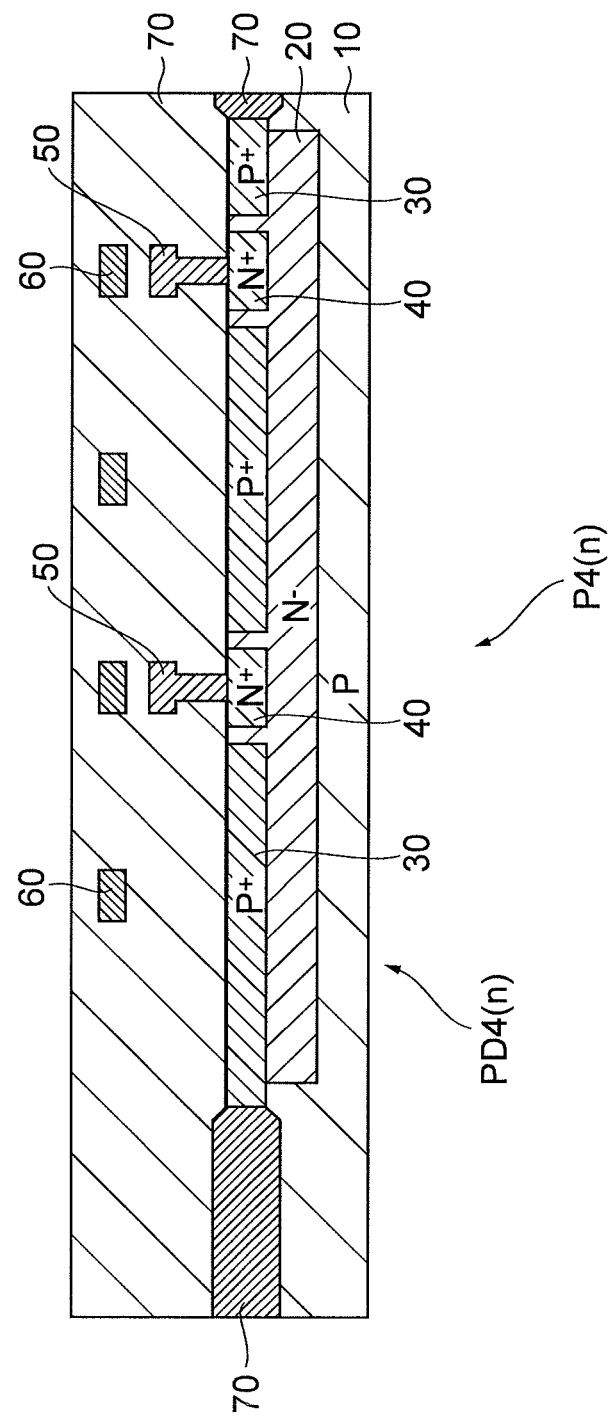
FIG. 11 is a drawing showing a cross section of the light receiving portion along the line XI-XI in FIG. 10.

FIG. 10 is a drawing showing the fourth embodiment of the light receiving portions P(n) shown in FIG. 1, which shows the light receiving portion P4(n) viewed from the front side, and FIG. 11 is a drawing showing a cross section of the light receiving portion P4(n) along the line XI-XI in FIG. 10. In FIGS. 10 and 11, the nth light receiving portion P4(n) is shown on behalf of the N light receiving portions P4(n). This light receiving portion P4(n) is provided with a plurality of light blocking films 60 (e.g., four films), in addition to the light receiving portion P3(n) of the third embodiment. The other configuration of the light receiving portion P4(n) is the same as that of the light receiving portion P3(n). FIG. 10 is drawn without illustration of below-described p-type high-concentration semiconductor region 30 in the embedded photodiode PD4(n), for easier understanding of the feature of the present invention.

The light blocking films 60 extend in the array direction of the light receiving portions P(n) shown in FIG. 1. Each of the light blocking films 60 is arranged so as to cover the n-type high-concentration semiconductor region 40 and the interconnection 50 connected to the n-type high-concentration semiconductor region 40 and extending in the array direction. A material of the light blocking films is, for example, Al, and a preferred material thereof is one with a light absorbing property, e.g., TiN or the like which is advantageous in preventing scattering of light to be detected.

The operational effect of the light receiving portion P4(n) of the fourth embodiment will be described in comparison to the light receiving portion P3(n) of the third embodiment.

Figure 12:
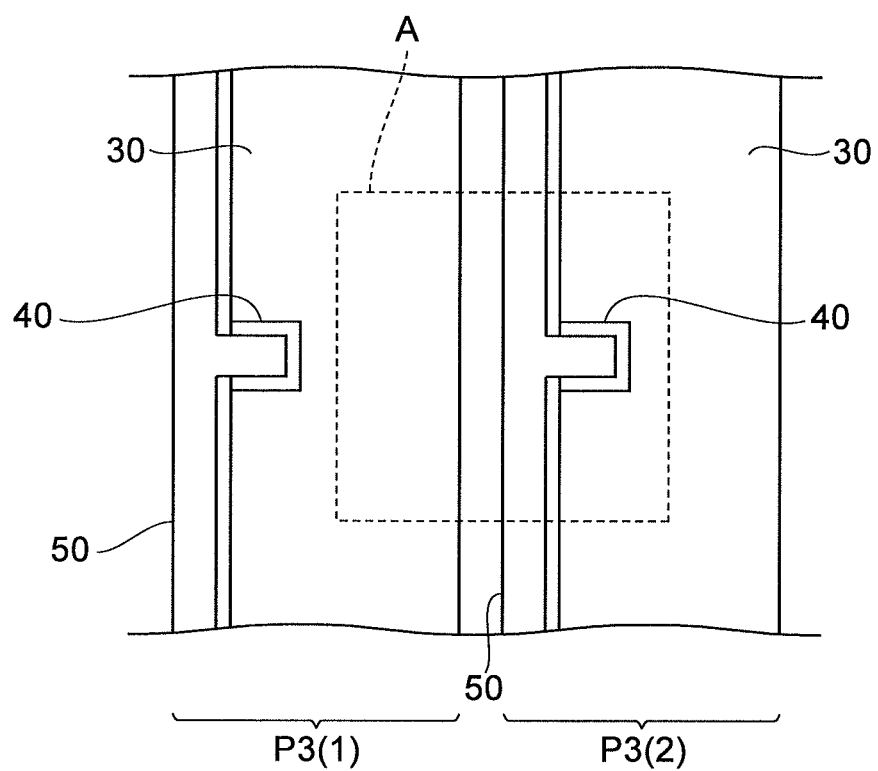
FIG. 12 is a drawing showing light receiving portions in the third embodiment, in which light impinges over adjacent light receiving portions.
Figure 13:
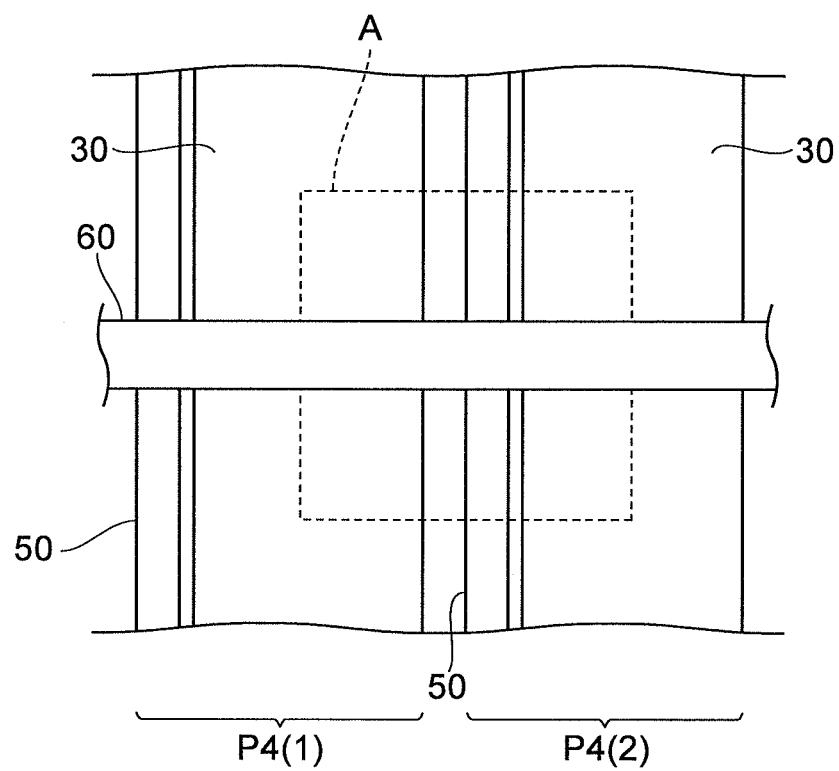
FIG. 13 is a drawing showing light receiving portions in the fourth embodiment, in which light impinges over adjacent light receiving portions.

FIG. 12 is a drawing showing the light receiving portions P3(n) of the third embodiment, in which light impinges over adjacent light receiving portions P3(1), P3(2), and FIG. 13 is a drawing showing the light receiving portions P4(n) of the fourth embodiment, in which light impinges over adjacent light receiving portions P4(1), P4(2).

In the light receiving portions P3(n) of the third embodiment, when incident light A impinges over the adjacent light receiving portions P3(1), P3(2) and on a charge readout line of the embedded photodiode PD3(2) in one light receiving portion P3(2) as shown in FIG. 12, the sensitivity of the one light receiving portion P3(2) becomes lower by the area of the n-type high-concentration semiconductor region 40 and the interconnection 50 extending in the array direction, which may cause a discrepancy between the light detection sensitivities of the adjacent light receiving portions P3(1), P3(2).

However, in the case of the linear image sensor 1C with the light receiving portions P4(n) of the fourth embodiment, as shown in FIG. 13, the light blocking film 60 extending in the array direction is provided so as to cover the n-type high-concentration semiconductor region 40 and the interconnection 50 extending in the array direction, and therefore the shape of the photosensitive region becomes bilaterally symmetric with respect to the center axis extending in the longitudinal direction of the light receiving portion P4(n). Namely, it is feasible to relax the asymmetry to be caused by the n-type high-concentration semiconductor region 40. Therefore, the discrepancy between the light detection sensitivities of the adjacent light receiving portions P4(1), P4(2) can be reduced even in the case where the light A impinges over the adjacent light receiving portions P4(1), P4(2).

The present invention can be modified in various ways without having to be limited to the embodiments described above. For example, the shape of the interconnection 50 and the array positions of the n-type high-concentration semiconductor regions 40 do not have to be limited to those in the embodiments. For example, FIG. 14 and FIG. 15 show the light receiving portion P5(n) according to a modification example of the present invention.

Figure 14:
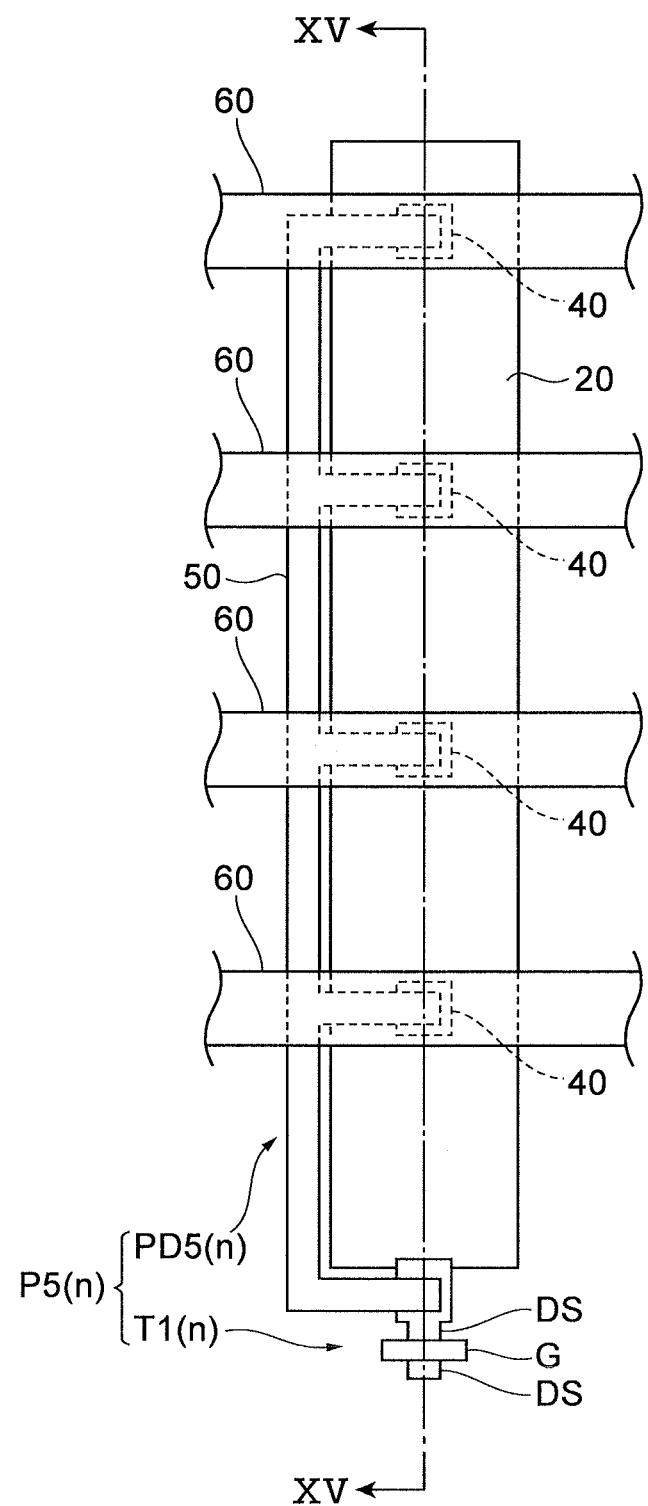
FIG. 14 is a drawing showing a modification example of the light receiving portions shown in FIG. 1, which shows a light receiving portion viewed from the front side.
Figure 15:
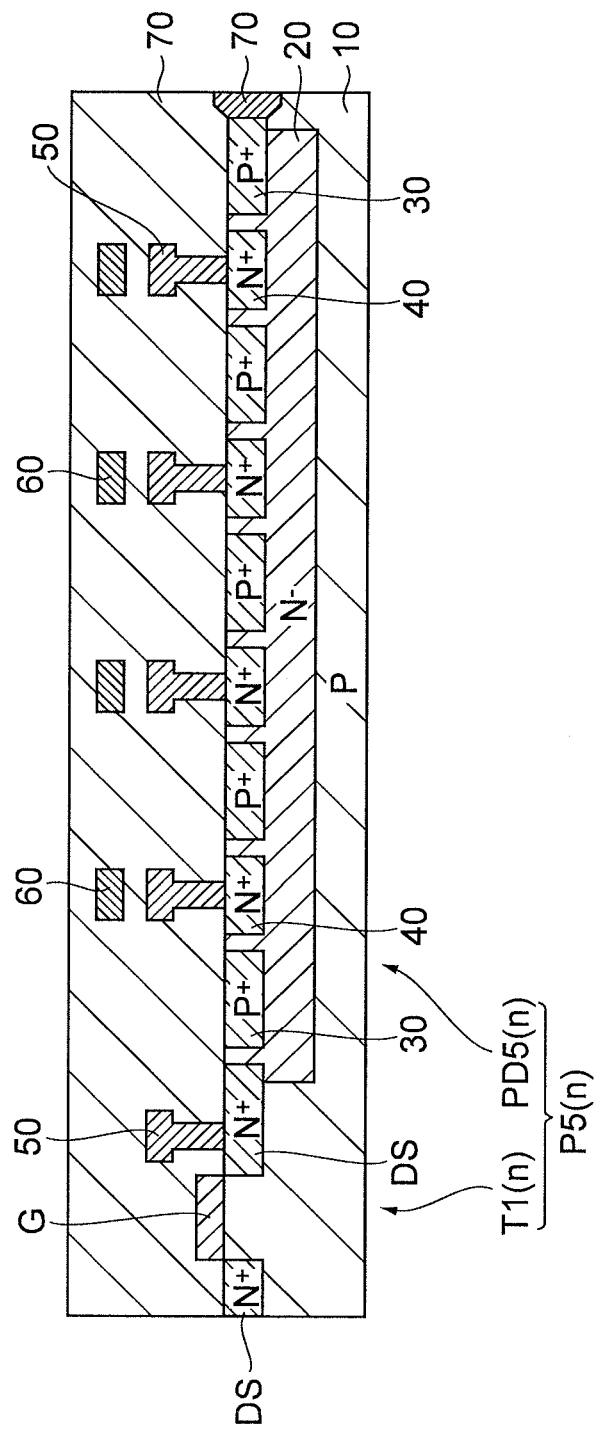
FIG. 15 is a drawing showing a cross section of the light receiving portion along the line XV-XV in FIG. 14.

FIG. 14 is a drawing showing the modification example of the light receiving portions P(n) shown in FIG. 1, which shows the light receiving portion P5(n) viewed from the front side, and FIG. 15 is a drawing showing a cross section of the light receiving portion P5(n) along the line XV-XV in FIG. 14. In FIGS. 14 and 15, the nth light receiving portion P5(n) is shown on behalf of the N light receiving portions P5(n). This light receiving portion P5(n) has an embedded photodiode PD5(n) and the aforementioned transistor T1(n). FIG. 14 is drawn without illustration of below-described p-type high-concentration semiconductor region 30 in the embedded photodiode PD5(n), for easier understanding of the feature of the present invention.

As shown FIGS. 14 and 15, in the configuration wherein the n-type high-concentration semiconductor regions 40 of the embedded photodiode PD5(n) are arrayed along the center axis extending in the longitudinal direction of the n-type low-concentration semiconductor region 20, the interconnection 50 connected to the n-type high-concentration semiconductor regions 40 may be drawn in the array direction of the light receiving portions P5(n) and extend on the p-type substrate 10 between the n-type low-concentration semiconductor regions 20 in adjacent embedded photodiodes PD5(n). In this case, it is preferable to provide the light blocking films 60 extending in the array direction, so as to cover the n-type high-concentration semiconductor regions 40 and the interconnection 50 extending in the array direction, in order to reduce the discrepancy between the light detection sensitivities of the adjacent light receiving portions P(n) to be caused by the interconnection 50 extending in the array direction.

In the embodiments the embedded photodiodes PD(n) and transistors T(n) are formed directly on the p-type substrate 10, but they may be formed on an n-type substrate. In this case, a p-type well is formed on the n-type substrate and the same configuration may be formed on this p-type well.

INDUSTRIAL APPLICABILITY

The present invention is applicable to usage to reduce the remnant charge in readout of charge from the linear image sensor.

LIST OF REFERENCE SIGNS 1, 1A, 1B, 1C, 1X linear image sensor
P(n), P1(n), P2(n), P3(n), P4(n), P5(n), Px(n) light receiving portions
PD(n), PD1(n), PD2(n), PD3(n), PD4(n), PD5(n), PDx(n) embedded photodiodes
10 p-type substrate (first semiconductor region)
20 n-type low-concentration semiconductor region (second semiconductor region)
30 p-type high-concentration semiconductor region (third semiconductor region)
40 n-type high-concentration semiconductor regions (fourth semiconductor regions)
50 interconnection
60 light blocking films
70 silicon oxide film
T(n), T1(n), Tx(n) transistor
DS n-type high-concentration semiconductor regions
G gate electrode

The invention claimed is:

1. A linear image sensor in which a plurality of embedded photodiodes of an elongated shape are arrayed, each of the plurality of embedded photodiodes comprising:
   a first semiconductor region of a first conductivity type;
   a second semiconductor region formed on the first semiconductor region, having a low concentration of an impurity of a second conductivity type, and having the elongated shape;
   a third semiconductor region of the first conductivity type formed on the second semiconductor region so as to cover a surface of the second semiconductor region;
   a fourth semiconductor region of the second conductivity type for extraction of charge from the second semiconductor region, the fourth semiconductor region having a plurality of fourth semiconductor regions arranged separated in a longitudinal direction of the second semiconductor region on the second semiconductor region; and a plurality of read-out transistors each arranged adjacently to a corresponding one of the plurality of embedded photodiodes in the longitudinal direction thereof, wherein each of the plurality of fourth semiconductor regions are arranged separated in the longitudinal direction of the second semiconductor region and are connected to a corresponding interconnection, and each of the plurality of fourth semiconductor regions are formed as islands within a corresponding one of the plurality of embedded photodiodes, and the corresponding interconnection is connected to a corresponding one of the plurality of read-out transistors for reading out a corresponding fourth semiconductor region, wherein a semiconductor region that serves as a drain or as a source for each of the plurality of read-out transistors also serves as one of the plurality of fourth semiconductor regions in each of the plurality of embedded photodiodes.

2. The linear image sensor according to claim 1, wherein the plurality of fourth semiconductor regions are arranged along a center axis extending in the longitudinal direction of the second semiconductor region.

3. The linear image sensor according to claim 1, wherein the plurality of fourth semiconductor regions are arranged along a long side extending in the longitudinal direction of the second semiconductor region.

4. The linear image sensor according to claim 1, wherein the plurality of fourth semiconductor regions are arranged alternately in a staggered pattern along two long sides extending in the longitudinal direction of the second semiconductor region.

5. The linear image sensor according to any one of claims 1 to 4, comprising a light blocking film to cover the plurality of fourth semiconductor regions, said light blocking film extending in an array direction.

* * * * *